United States Patent [19]
Genba

[11] Patent Number: 5,168,384
[45] Date of Patent: Dec. 1, 1992

[54] MINIATURE LIQUID CRYSTAL DISPLAY DEVICE

[75] Inventor: Yasuo Genba, Akigawa, Japan

[73] Assignee: Casio Computer Co., Ltd., Tokyo, Japan

[21] Appl. No.: 655,679

[22] Filed: Feb. 14, 1991

[30] Foreign Application Priority Data

Feb. 20, 1990 [JP] Japan .................. 2-37231

[51] Int. Cl.⁵ .................. G02F 1/13; H04N 5/30; G03B 13/02
[52] U.S. Cl. .................. 359/83; 359/88; 358/224; 354/219
[58] Field of Search .............. 359/73, 54, 83, 87, 359/88; 358/224; 354/49, 474, 475

[56] References Cited

U.S. PATENT DOCUMENTS

| | | | |
|---|---|---|---|
| 4,659,183 | 4/1987 | Suzawa | 359/69 |
| 4,772,100 | 9/1988 | Suenaga | 359/83 |
| 4,796,977 | 1/1989 | Drake | 359/83 |
| 4,836,651 | 6/1989 | Anderson | 359/88 |
| 4,963,001 | 10/1990 | Miyajima | 359/83 |
| 4,963,987 | 10/1990 | Ichiyoshi et al. | 358/224 |
| 5,018,839 | 5/1991 | Yamamoto et al. | 359/73 |
| 5,029,984 | 7/1991 | Adachi et al. | 359/88 |

FOREIGN PATENT DOCUMENTS

| | | |
|---|---|---|
| 2624295 | 9/1989 | France . |
| 60-225118 | 11/1985 | Japan . |
| 2-74922 | 3/1990 | Japan . |
| 2124010 | 2/1984 | United Kingdom . |
| WO90/04806 | 5/1990 | World Int. Prop. O. . |

Primary Examiner—Janice A. Howell
Assistant Examiner—Huy K. Mai
Attorney, Agent, or Firm—Frishauf, Holtz, Goodman & Woodward

[57] ABSTRACT

A miniature liquid crystal display panel device comprises a plurality of column and row terminals. On a squarish frame holder is formed an opening for a light passage in the middle of an enclosing wall and a support portion for mounting the display panel. First and second IC units each including a flexible wiring film and an IC chip are disposed outside the enclosing wall of the holder. A flexible circuit connector for respectively connecting first and second IC units to a control circuit is wound around the outside of the holder. A light source for projecting the display panel is disposed opposite to the display panel in the rear side of the device.

7 Claims, 7 Drawing Sheets

MINIATURE LIQUID CRYSTAL DISPLAY DEVICE

BACKGROUND OF THE INVENTION

1. Field of the Invention

The present invention relates to a miniature liquid crystal display device used for a viewfinder or a projector, etc.

2. Description of the Related Art

In a conventional viewfinder for a video camera unit for displaying a pictured image based on a video signal supplied from a video camera apparatus incorporated with a CCD (charge-coupled device) image device and a video tape employs a CRT (cathode ray tube) display as display means. However, such a conventional viewfinder provided with the CRT display has some disadvantages that it is heavy in weight and causes the whole of the unit to become bulky, thus incurring much inconvenience to carry the video camera unit.

As a result of this, recently, there is an idea to use a light-weight and compact liquid crystal display panel as a display means of the viewfinder. This liquid crystal display panel has transparent column and row electrodes on the opposing surfaces of a pair of transparent glass substrates in a matrix form, and sealing liquid crystal therebetween, so that a pictured image can be displayed according to a video signal supplied from the video camera apparatus, by driving the column and row electrodes through driver IC chips.

In such a viewfinder, naturally, those electronic parts such as the driver IC chips, etc. are confined to be disposed in a space out of a light passage passing through an eyepiece portion, the liquid crystal display panel, and a backlight. Because of this, for the liquid crystal display panel device provided with driver IC chips is used a so-called "chip on glass" manufacturing method in which each glass substrate of the display panel is formed much larger than a display region so as to form a wiring pattern for connection on a peripheral portion of each glass substrate outside the display region, so that the driver IC chip would be bonded to the wiring pattern on the peripheral portion of each glass substrate.

According to this method, however, a space for mounting the IC chip is needed outside the periphery portion of the display region of the display panel, so that the display panel becomes larger. This increases the cross section of the viewfinder and causes the whole size of the camera unit to be larger.

Such a problem also appears in an image projector using the liquid crystal display panel. The object of the present invention is to provide a miniature liquid crystal display device which can make the outer periphery of the display panel smaller than the conventional one, thereby causing the whole of the unit to be smaller.

SUMMARY OF THE INVENTION

According to the present invention, a miniature liquid crystal display device comprises a housing including a main body having a cylindrical shape, a lens case having an eyepiece portion at a distal end, and a magnifying lens fixed at said lens case. A display panel unit is disposed in the main body of the housing, the display panel including a squarish frame holder having a predetermined width and an opening formed in an axial direction for passing a light through said width, said squarish frame holder having a first end facing said magnifying lens and a second end opposing said first end; and a liquid crystal display panel disposed in the vicinity of said second end so as to arise a dark space in said opening of said squarish frame holder between said magnifying lens and said liquid crystal display panel. A plurality of integrated circuit assemblies are provided, each disposed on an outside of a different side of said squarish frame holder and electrically connected to the liquid crystal panel, each of the integrated circuit assemblies including a circuit tape and an integrated circuit chip bonded to said circuit tape. A light source is disposed in the housing so as to face the liquid crystal panel for projecting the display panel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
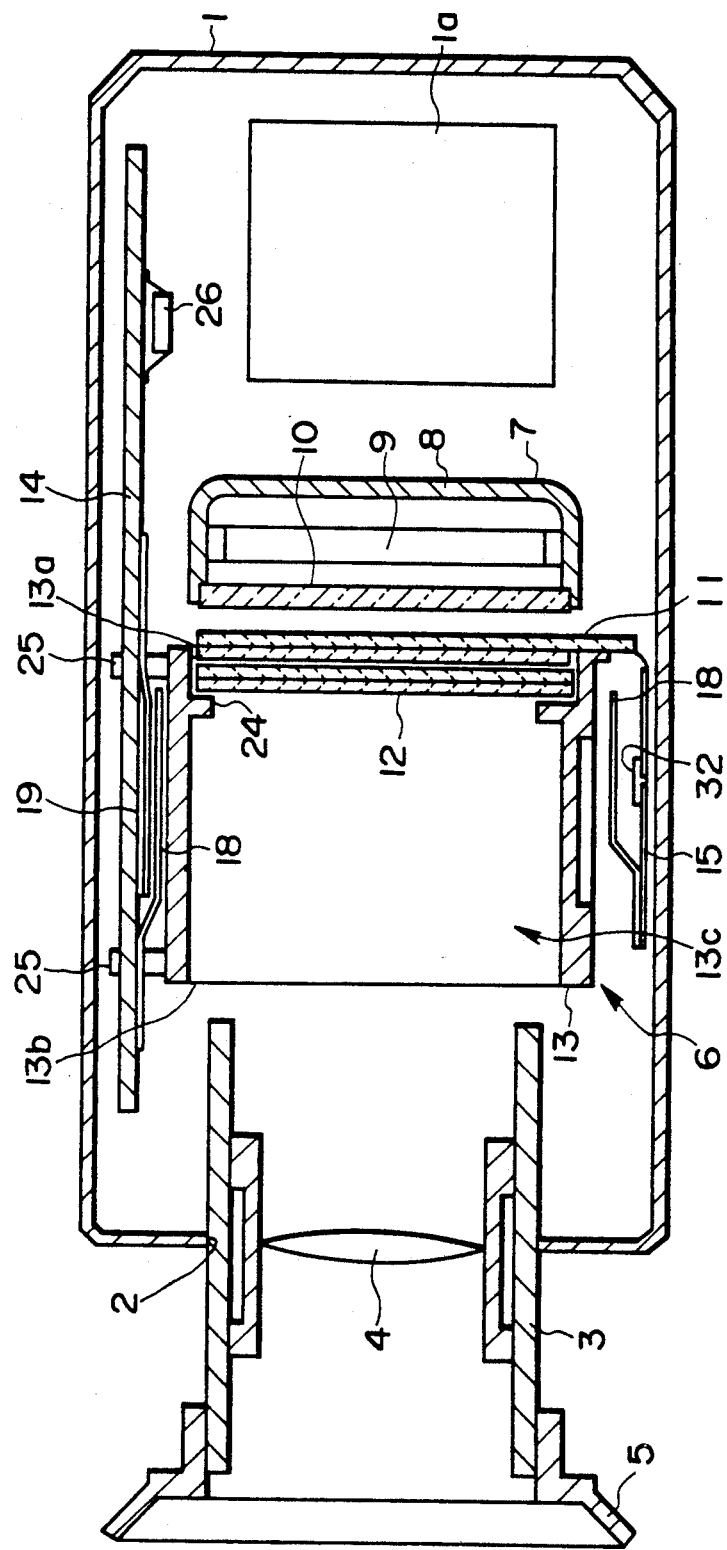
FIG. 1 is a longitudinally sectioned view of a view finder accommodating a backlighted display panel device of the invention.

Referring to the drawings, embodiments each of which apply a backlighted display panel device of the invention to a viewfinder for a video camera are described below.

FIG. 1 shows a whole structure of a viewfinder. In the figure, reference numeral 1 designates a finder main body. The finder main body 1 is formed to have a cylindrical shape. An opening portion 1a for connecting with a video camera apparatus (not shown) is formed in a right side of the finder main body, and the other opening portion 2 is provided in a left side of the finder main body 1. A lens cylinder 3 is mounted in the opening portion 2 in partly projecting to the outside of the finder main body 1. A magnifying lens 4 is slidably mounted within the lens cylinder 3, and an eyepiece portion 5 is mounted on the outer end portion of the lens cylinder 3.

A display panel unit 6 and a backlight unit 7 are installed inside the finder main body 1. Display panel unit 6, backlight unit 7, and magnifying lens 4 are arranged on an optical axis of a light source described later. Beside, the backlight unit 7 comprises a light case 8, a light source 9 which is placed inside of the light case 8 and is a fluorescent lamp, etc. and a diffusion plate 10 at a side facing the display panel unit 6. The backlight unit 7 is so constructed that light from the light source 9 is diffused by the diffusion plate 10 and is projected toward the display panel unit 6.

Figure 2:
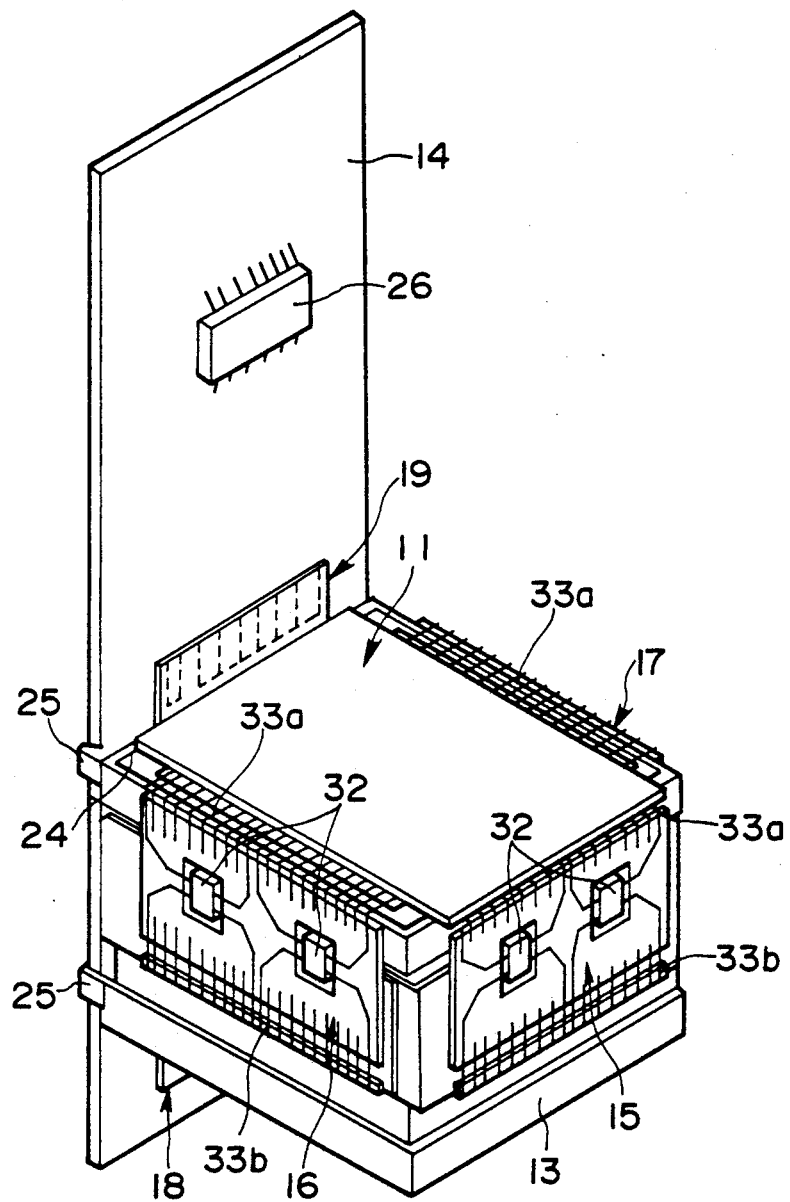
FIG. 2 is perspective view showing a whole structure of the display panel device shown in FIG. 1.
Figure 3:
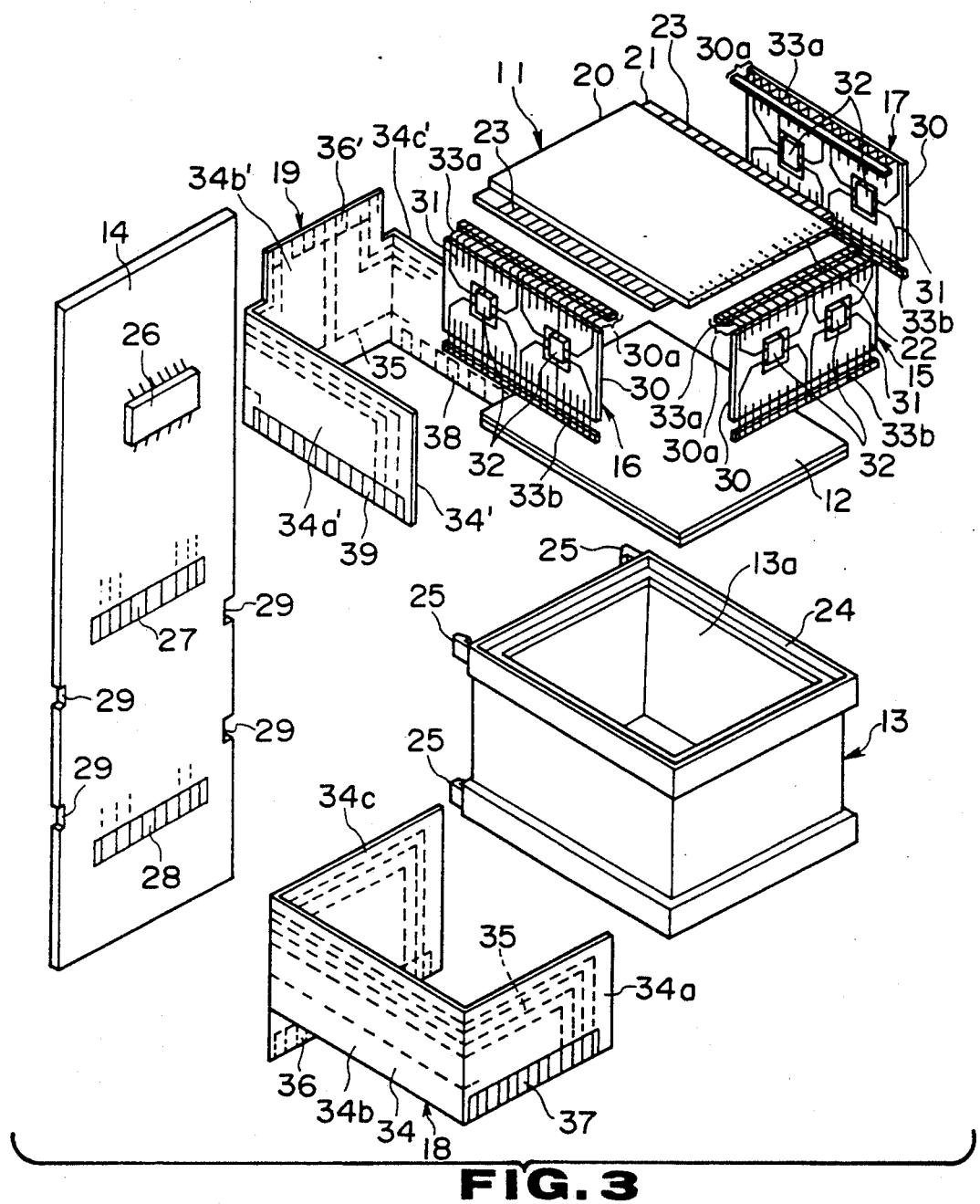
FIG. 3 is an exploded perspective view of the display panel shown in FIG. 2.

FIGS. 2 and 3 show a structure of the display panel unit 6. The display panel unit 6 employs liquid crystal display panel 11, a liquid crystal cell 12 for a color-compensation, a squarish or rectangular-like frame holder 13, a circuit board 14, and an IC (Integrated Circuit) unit 15 for column electrodes, IC units 16, 17 for row electrodes, and first and second wiring boards 18, 19 for connection, etc.

The liquid crystal display panel 11 for displaying information such as images, etc. with color, is provide with transparent column electrodes and transparent row electrodes respectively mounted on opposing surfaces of a pair of upper and lower glass substrates 20, 21 so as to be opposed to each other in a matrix fashion, and liquid crystal which is sealed between the pair of opposed glass substrates 20, 21. Liquid crystal of the display panel 11 is a so-called STN (super twisted nematic) which the twisted angle of liquid crystal material is designed in a range from about 150° to about 270° at non-voltage application. In this liquid crystal display panel 11, a number of intersections which the column electrodes and the row electrodes are crossed with a gap therebetween are picture elements, respectively and color filters of red, green, and blue are arranged to oppose to each of picture elements. As shown in FIG. 3, the upper glass substrate 20 projects sideward at its one side end portion in the longitudinal direction thereof from the lower glass substrate 21, and column electrode terminals 22 are arranged on the projected portion. The lower glass substrate 21 project sideward at its both side end portions in the width direction thereof from the upper glass substrate 20, and row electrode terminals 23 are arranged on the projected both side end portions. The liquid crystal cell 12 is for compensating a phase difference of color induced from wavelength dependency for multiple refraction which occurs while the light passes through liquid crystal of the liquid crystal display panel 11. The liquid crystal cell 12 has neither column and row electrodes nor color filters, and is so constructed that twisted angle of liquid crystal is constantly twisted in the opposing direction opposite to that of the liquid crystal display panel 11.

The squarish or rectangular-like frame holder 13 is to hold the liquid crystal display panel 11 and the liquid crystal cell 12, and is shaped as a frame which is square in cross section. That is, the holder 13 has an opening portion 13a corresponding to a display region of the liquid crystal display panel 11. At the upper side of the holder 13, an indent portion 24 is formed for supporting the liquid crystal display panel 11 and the liquid crystal cell 12 which are placed closely to each other. Engaging hooks 25 projecting outwardly are provided at four corners of one of four side walls of the squarish holder 13.

The circuit board 14 is formed of hard board such as epoxy resin, etc. and has a surface on which wiring pattern (not shown) is formed. A control IC chip 26, and connecting terminals 27 and 28 are mounted on the circuit board 14. Except for these connecting terminals 27 and 28, the entire surface of the circuit board 14 is coated with solder resist.

Engaging recesses 29 are provided at both side edges of the circuit board 14. Engaging hooks 25 of the holder 13 can removably engage with these vertical recesses 29. The circuit board 14 is connected to the video camera by means of lead wires (not shown) passing though the opening portion 1a so that video signal is supplied to the circuit board 14.

The IC units 15 through 17 are for driving the liquid crystal display panel 11. The IC unit 15 is electrically connected to the column electrode terminals 22 of the liquid crystal display panel 11, and the IC units 16 and 17 are electrically connected to the row electrode terminals 23, 23 of the liquid crystal display panel 11, respectively by coupling means such as conductive adhesive agent or soldering, etc. It is recommended to use the conductive adhesive agent which is formed by dispersing connecting particles consisted of conductive particles or non-conductive particles covering conductive particles with "hot melt" type insulating film in "hot melt" type insulative adhesive agent, so as to bring electrical conductivity in the thickness direction thereof in the bonded condition.

Each of IC units 15 through 17 is formed by a TAB (Tape Automated Bonding) method. That is, each of IC units 15 through 17 is constructed by pattern forming of a plurality of lead wires 31 on an insulating film 30, and inner lead bonding of drive IC chips 32 to the inner ends of the lead wires 31. Each of lead wires 31 has an outer end 33a or 33b respectively extended to the panel 11 so as to be connected to an electrode terminal 23 or extended to the opposite direction to the panel 11 so as to be connected to a flexible circuit connector 18 or 19 described hereinafter. A slit 30a is formed in one end portion of insulating film 30 so as to facilitate the following described bending of lead wires 31. It is important to bend the lead wires 31 at right angles in a slit 30a near the side end portion of the liquid crystal display panel 11 because the arrangement of the IC units 15 through 17 is achieved around the side walls of the cylindrical holder 13. This means that the IC units 15 through 17 are arranged in a space along the longitudinal direction of the finder main body 1 between the inner surface of the finder main body 1 and the peripheral portion of the liquid crystal display panel 11 when the display panel unit 6 is installed in the finder main body 1. As shown in FIG. 1, in this structure, apparently, the IC units 15 through 17 on which the IC chips 32 are mounted are not arranged in the light passage o light axis from the light source 9 to the magnifying lens 4. The flexible circuit connectors 18, 19 are for connecting the IC units 15 through 17 to the circuit board 4. The first flexible circuit connector 18 connects the IC units 15 for driving the column electrodes to the circuit board 4, and the second flexible circuit connector 19 connects the IC units 16, 17 for the row electrodes to the circuit board 4.

These flexible circuit connectors 18, 19 are constructed by forming the wiring patterns 35, 35' on the surfaces of flexible insulating tapes 34, and 34' with covering solder resist on the surfaces, and by providing board-side terminals 36, 36' and unit-side terminals 37, 38, and 39 at the predetermined portion.

In this case, the unit-side terminals 37 are provided at the lower portion of one end portion 34a of the first flexible circuit connector 18, a portion projecting in a lower side is provided at the other end portion 34c thereof, and the board-side terminals 36 are provided at the projected portion.

This first flexible circuit connector 18 is bent into a U-shaped configuration, in which the one end portion 34a thereof is disposed between the holder 13 and the IC unit 15 with the unit-side terminals 37 being connected to the lower side outer ends 33b of the lead wires 31 of the IC unit 15 by soldering and the like, the middle portion 34b thereof is disposed between the holder 13 and the IC unit 16, and the other end portion 34c thereof is disposed between the holder 13 and the circuit board 14 with the board-side terminals 36 being connected to the connector terminals 28 at the lower side of the circuit board 14 by soldering and the like.

The unit-side terminals 38, 39 are provided at the lower portion of the both end sides of the second flexible circuit connector 19, the middle portion thereof upwardly projects, and the board-side terminals 36 are provide at the projected upper portion. This second flexible circuit connector 19 is also bent into an U-shaped configuration, in which the both end portions 34a', 34c' thereof are disposed between the holder 13 and the IC units 16, 17 with the unit-side terminals 38, 39 being connected to the outer ends 33b of the lower sides of the lead wires 31 by soldering and the like, and the middle portion 34b' thereof is disposed between the holder 13 and the circuit board 14 with board-side terminals 36' being connected to the connector terminals 27 of the upper side of the circuit board 14 by soldering and the like. Although not being shown, a plurality of chip parts are mounted on these flexible circuit connectors 18 and 19.

In the viewfinder of FIG. 1, the holder 13 is so arranged that a side of the liquid crystal display panel 11 faces in the opposite direction to the magnifying lens 4, in the other words that the rear end portion 13b faces the magnifying lens side. The light source unit 7 is disposed near the liquid crystal display panel 11 to face thereto. According to the above structure, the side walls of the squarish frame holder 13 perfectly shields the incident light leaking from the finder main body, and a dark space 13c arises between the magnifying lens 4 and the liquid crystal display panel 11. In consequence, only the light emitted from the light source 9 is projected on the magnifying lens 4 to increase an image contrast.

Next, referring now to FIGS. 4 through 7, a method how to construct an IC assembly will be explained. That is, the IC units 15 through 17 are connected to the liquid crystal display panel 11, and the first and second flexible circuit connectors 18, 19 are connected to the IC units 15 through 17. The IC assembly is wound around the side walls of the squarish holder 13. Note that the IC units 15 through 17 and the first and second flexible circuit connectors 18, 19 construct an IC assembly.

Figure 4:
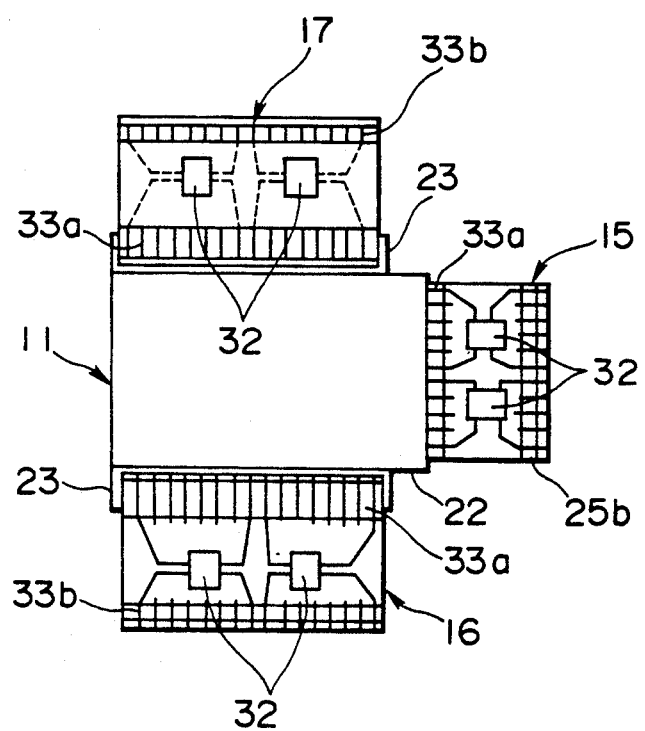
FIGS. 4 through 7 are plan views showing a method which connects IC Units and connection wiring substrates to the display panel.

First, as shown in FIG. 4, the IC units 14 through 17 are respectively connected to the column electrode terminals 22 and the row electrode terminals 23 of the liquid crystal display panel 11 in a plane. That is, the panel-side outer ends 33a of the lead wires 31 of the IC unit 15 are connected to the column electrode terminals 22 of the liquid crystal display panel 11, and the panel-side outer ends 33a of the lead wires 31 of the IC units 16, 17 are connected to the row electrode terminals 23 of the liquid crystal display panel 11, in both cases the connections are achieved by using connection means such as conductive adhesive agent or soldering means, and the like. In this way, at first, the IC units 15 through 17 are attached to the liquid crystal display panel 11 so as to separately extend in each of three directions in a plane. As shown in FIG. 3, the lead wires 31 of the IC unit 17 are bent reversely to those of the IC units 15 and 16, because every IC chip 32 is the same one. But, all of the IC units 15 through 17 can be constructed in the same one, provided the IC chip 32 has switching terminals for a scanning direction of shift resisters.

Figure 5:
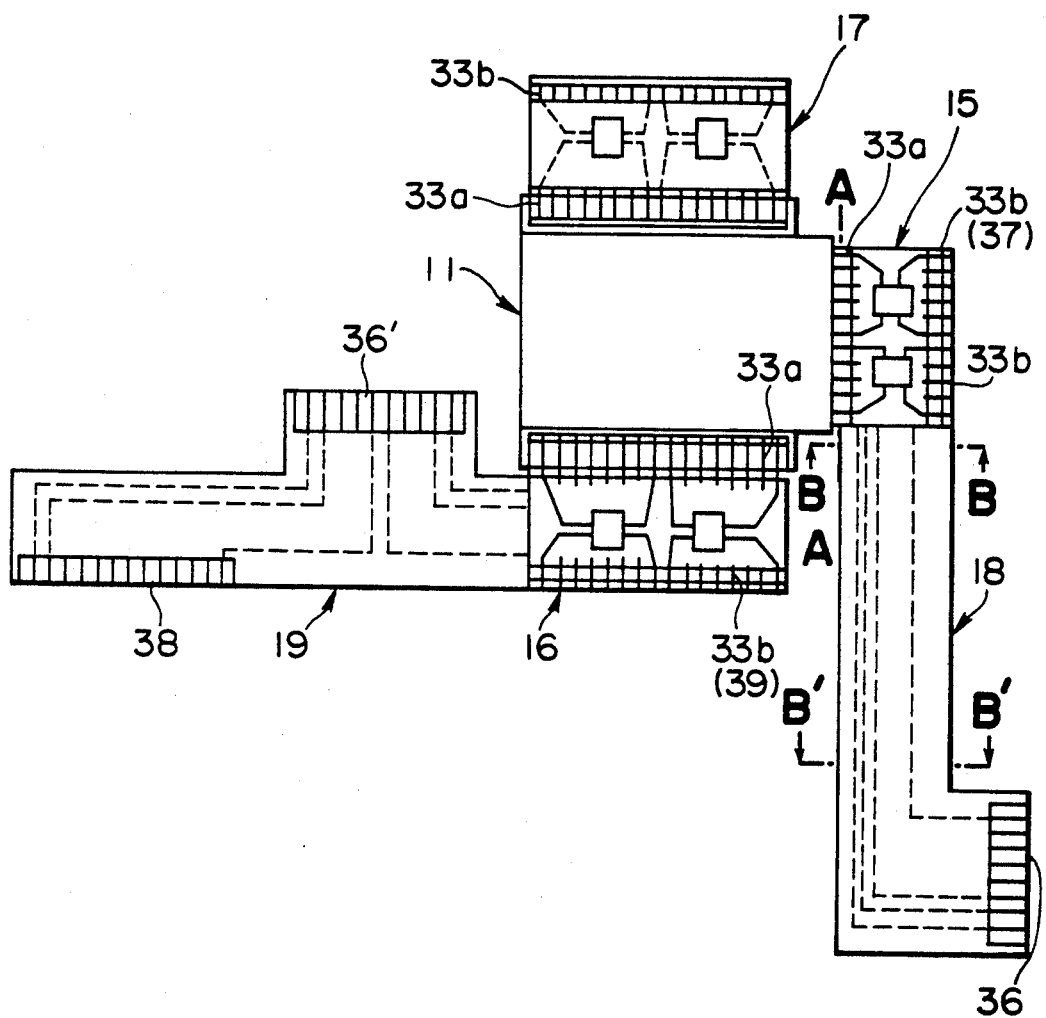

Next, as shown in FIG. 5, the first and second flexible circuit connectors 18, 19 are connected to the IC units 15, 16 in a plane. That is, the first flexible circuit connector 18 is disposed under the lower side of the IC unit 15 for driving the column electrodes, and the unit-side terminals 37 of the flexible circuit connector 18 are connected to the board-side outer ends 33b of the lead wires 31 of the IC unit 15 by using the above described connection means. Further, the second flexible circuit connector 19 is disposed under the IC unit 16 for the row electrodes and the unit-side terminals 39 at one end of the flexible circuit connector 19 are connected to the board-side outer end portions 33b of the lead wires 31 of the IC unit 16 by using the above described connection means.

After that, the lead wires 31 of the IC unit 15 is bent at right angles to the liquid crystal display panel 11 at a position shown in FIG. 5 with a two-dot chained line A—A, in other words, at a position of the panel-side outer ends 33a of the lead wires 31. As a result, the IC Unit 15 and one end portion of the flexible circuit connector 18 face one of four side walls of the squarish frame holder 13. Next, the first flexible circuit connector 18 is bent at right angles at positions shown in FIG. 5 with two-dot chained lines B—B, B'—B', so that the first flexible circuit connector 18 is bent to have an U-shaped configuration, that is, wound around the periphery of the holder 13, as shown in FIG. 6.

Figure 6:
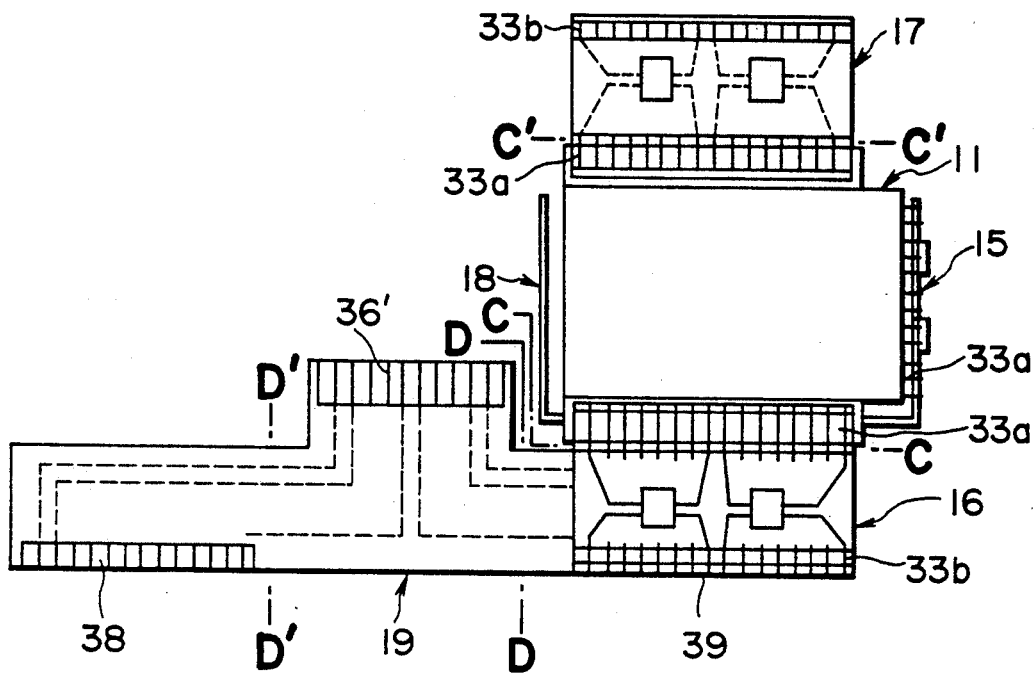

Then, the lead wires 31 of the IC unit 16 are bent at right angles to the liquid crystal display panel 11 at a position shown in FIG. 6 with a two-dot chained line C—C, in other words, at a position of the panel-side outer ends 33a of the lead wires 31. As a result, the IC unit 16 and one end portion of the flexible circuit connector 19 face one of four side walls of the holder 13. The second flexible circuit connector 19 is bent at right angles at positions shown in FIG. 6 with two-dot chained lines D—D, D'—D', so that the second flexible circuit connector 19 is bent to have an U-shaped configuration, that is, would around the periphery of the holder 13, as shown in FIG. 7.

Next, the lead wires 31 of the IC Unit 17 are bent at right angles to the liquid crystal display panel 11 at a position of the panel-side outer ends 33a shown in FIG. 6 with a two-dot chained line C'—C', and then the board-side outer ends 33b of the IC Unit 17 are connected to the unit-side terminals 38 of the second flexible circuit connector 19 by using the above described connection means.

Figure 7:
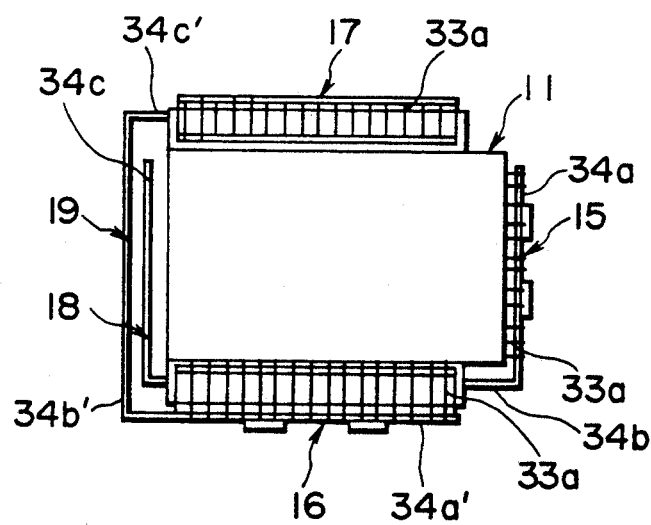

As a result, as shown in FIG. 7, the first and second flexible circuit connectors 18, 19 are wound around the periphery of the squarish holder 13. Then, under a condition in which the unit-side terminals 37 at one end side of the first flexible circuit connector 18 are connected to the IC unit 15, the board-side terminals 3 at the other end side are connected to the connection terminals 28 at the lower side of the circuit board 14 by soldering. And, the middle board-side terminals 36' are connected to the connection terminals 27 at the upper side of the circuit board 14 by soldering under a condition in which the unit-side terminals 38, 39 at both end sides of the second flexible circuit connector 19 are connected to the IC units 16, 17.

In this way, according to the present invention the IC Units 15 through 17 are respectively connected to the column electrodes 22 and the row electrodes 23 of the liquid crystal display panel 11 carried by the holder 13, the panel-side outer ends 33a of the IC units 15 through 17 are respectively bent at right angles to the liquid crystal display panel 11, and the first and second flexible circuit connectors 18, 19 connected to the board-side outer ends 33b are wound around the outer periphery of the holder 13. Therefore, electronic parts such as the IC chips 32, etc. can be disposed without obstructing the light path of the liquid crystal display panel 11. That is, the periphery of the liquid crystal display panel 11 merely needed to form the column electrode terminals 2 and the row electrode terminals 23 for connecting outer ends of wires 31, the dimension of the liquid crystal display panel 11 can be formed smaller than the conventional one, thus allowing the whole device smaller in size and lighter in weight than the conventional one.

Figure 8:
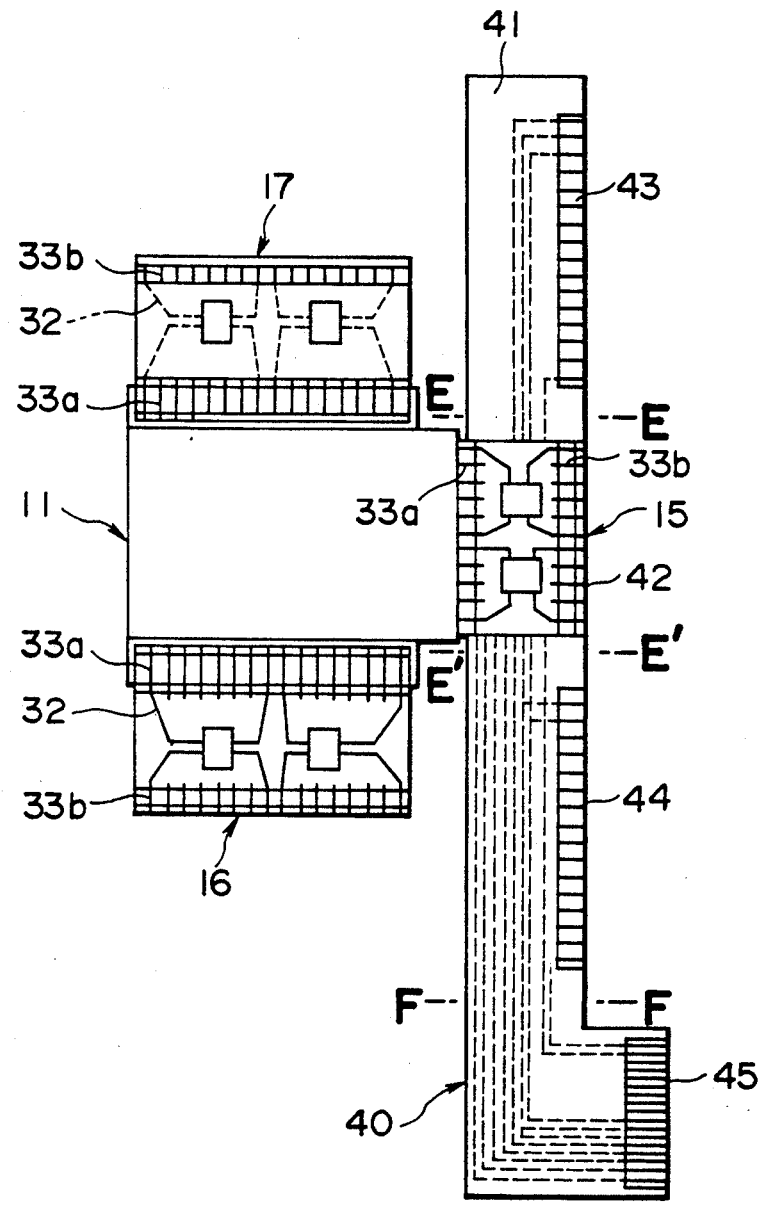
FIG. 8 is a plan view showing another embodiment of the display panel unit of the invention.

It should be understood, however, that the scope of the invention is not limited to the embodiment described above. For example, there is no need to limit the number of the flexible circuit connector merely to two, three of them may also be introduced, and yet, only a single flexible circuit connector may also be introduced as shown in FIG. 8. That is, when a single flexible circuit connector 40 is introduced, such construction is employed as that unit-side terminals 42 for column electrodes are provided at a predetermined position of the lower edge side of a substantially flexible insulating tape 41 in its longitudinal direction, and in addition, unit-side terminals 43, 44 for row electrodes are provided on both side portions of the predetermined portion, and board-side terminals 45 are provided at a position neighboring to the position where the unit-side terminals 44 of one side is installed.

When the IC Units 14 through 17 are connected to the circuit board with the flexible circuit connector 40, for example, the unit-side terminals 42 for the row electrodes are connected to the board-side outer ends 33b of the lead wires 31 of the IC Unit 15 for the row electrodes, and then both sides of it are bent at right angles at positions shown with two-dot chained lines E—E, E'—E'. Next, the unit-side terminals 43, 44 for the row electrodes are respectively connected to the lower side outer ends 33b of the lead wires 31 of the IC units 16, 17 for the row electrodes. Further, one end side thereof is bent at right angles at a position shown with two-dot chained line F—F, and the board-side terminals 45 are connected to the connector terminal portion of the circuit board.

Although slits 33a are formed in insulating films 34, 34' of the IC units 15 through 17 in order to facilitate the bending of the lead wires 31, these slits 33a are not always necessary.

Furthermore, the twisted angle of liquid crystal material of the liquid crystal display panel may not necessarily be in a range from 150° to 270°, but instead, TN type liquid crystal having 90° of twisted angle may also be used. Furthermore, not only the liquid crystal cell 3, but a phase plate (wavelength plate) may also be used to compensate the phase difference of color passing through the liquid crystal display panel. If the liquid crystal display panel is the TN type in which the twisted angle of the liquid crystal material is 90°, either the liquid crystal cell or the phase plate may not necessarily be provided.

Referring again to FIG. 1, although the display panel unit 6 and the backlight unit 7 are disposed apart from each other, both of these units 6, 7 may be coupled by extending the display panel attaching portion of the holder 13 and integrally forming an engaging hook for engaging the backlight unit 7 on the extended portion.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A miniature liquid crystal display device comprising:
    a housing including a main body having a cylindrical shape, a lens case having an eyepiece portion at a distal end, and a magnifying lens fixed at said lens case;
    a display panel unit disposed in said main body of said housing, said display panel including:
        a squarish frame holder having a predetermined width and an opening formed in an axial direction for passing a light through said width, said squarish frame holder having a first end facing said magnifying lens and a second end opposing said first end; and
        a liquid crystal display panel disposed in the vicinity of said second end so as to arise a dark space in said opening of said squarish frame holder between said magnifying lens and said liquid crystal display panel;
    a plurality of integrated circuit assemblies each disposed on an outside of a different side of said squarish frame holder and electrically connected to said liquid crystal panel, each of said integrated circuit assemblies including a circuit tape and an integrated circuit chip bonded to said circuit tape; and
    light source means disposed in said housing so as to face said liquid crystal panel for projecting said display panel.

2. The miniature liquid crystal display device of claim 1, wherein said light source means comprises:
    a light source;
    a reflecting layer; and
    a diffusion layer directly facing said display panel for diffusing rays of light incident from said light source.

3. The miniature liquid crystal display device of claim 1, wherein said liquid crystal display panel comprises an STN liquid crystal display panel and a color compensation cell.

4. The miniature liquid crystal display device of claim 1, further comprising a control circuit board for controlling said integrated circuit chips of said integrated circuit assemblies.

5. The miniature liquid crystal display device of claim 4, wherein said frame holder has a plurality of hooks integrally formed thereon for engaging said control circuit board.

6. The miniature liquid crystal display device of claim 5, wherein each of said hooks is formed as a part of said frame holder.

7. The miniature liquid crystal display device of claim 5, further comprising a flexible circuit connector wound around said squarish frame holder to electrically connect said integrated circuit assemblies to said control circuit board.

* * * * *